(12) United States Patent
Takagi et al.

(10) Patent No.: US 11,929,307 B2
(45) Date of Patent: Mar. 12, 2024

(54) PLURALITY OF LEAD FRAMES FOR COOLING A POWER DEVICE

(71) Applicant: Hitachi Astemo, Ltd., Hitachinaka (JP)

(72) Inventors: Yusuke Takagi, Hitachinaka (JP); Ryo Terayama, Hitachinaka (JP); Ko Hamaya, Hitachinaka (JP); Osamu Ikeda, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 147 days.

(21) Appl. No.: 17/429,464

(22) PCT Filed: Jan. 15, 2020

(86) PCT No.: PCT/JP2020/000949
§ 371 (c)(1),
(2) Date: Aug. 9, 2021

(87) PCT Pub. No.: WO2020/166255
PCT Pub. Date: Aug. 20, 2020

(65) Prior Publication Data
US 2022/0108940 A1    Apr. 7, 2022

(30) Foreign Application Priority Data

Feb. 13, 2019    (JP) .................................. 2019-023952

(51) Int. Cl.
*H01L 23/495*    (2006.01)
*H01L 21/56*    (2006.01)
*H01L 23/31*    (2006.01)

(52) U.S. Cl.
CPC ........ *H01L 23/49537* (2013.01); *H01L 21/56* (2013.01); *H01L 23/3107* (2013.01);
(Continued)

(58) Field of Classification Search
CPC ......... H01L 2924/181; H01L 23/49537; H01L 21/56; H01L 23/3107; H01L 23/49568;
(Continued)

(56) References Cited

U.S. PATENT DOCUMENTS

2014/0110752 A1    4/2014    Fujino et al.
2015/0294927 A1    10/2015   Yamashita et al.
2017/0352629 A1    12/2017   Fukumoto et al.

FOREIGN PATENT DOCUMENTS

JP    2002-368171 A    12/2002
JP    2015-207675 A    11/2015
(Continued)

OTHER PUBLICATIONS

International Search Report with English translation and Written Opinion issued in corresponding application No. PCT/JP2020/000949 dated Mar. 31, 2020.

*Primary Examiner* — Alonzo Chambliss
(74) *Attorney, Agent, or Firm* — Foley & Lardner LLP

(57) ABSTRACT

A power semiconductor module, which is a semiconductor device, includes a semiconductor element 155 and a lead frame 318 that is disposed to face the semiconductor element 155 and connected to the semiconductor element 155 by a solder material 162. The lead frame 318 has the top surface 331 including a surface facing the semiconductor element 155, and the side surface 334 connected to the peripheral edge portion 333 of the top surface 331 at a predetermined angle with respect to the top surface 331. The top surface of the lead frame 318 includes the solder surface 332 that is in contact with the solder material 162 and the solder resistance surface on which the solder material 162 is less wettable than on the solder surface 332. The solder resistance surface is formed to surround the periphery of the solder surface 332. In this manner, when the semiconductor (Continued)

element and the lead frame are solder-joined in the semiconductor device, the region where the solder wet-spreads is appropriately controlled.

7 Claims, 5 Drawing Sheets

(52) U.S. Cl.
CPC .. *H01L 23/49513* (2013.01); *H01L 23/49524* (2013.01); *H01L 23/49541* (2013.01); *H01L 23/49548* (2013.01); *H01L 23/49568* (2013.01); *H01L 2924/181* (2013.01)

(58) Field of Classification Search
CPC ......... H01L 23/49541; H01L 23/49513; H01L 23/49524; H01L 23/49548
See application file for complete search history.

(56) References Cited

FOREIGN PATENT DOCUMENTS

| | | | |
|---|---|---|---|
| JP | 2016-146457 A | 8/2016 |
| WO | WO-2013/002338 A1 | 1/2013 |
| WO | WO-2014/038587 A1 | 3/2014 |
| WO | WO-2016/108261 A1 | 7/2016 |

PLURALITY OF LEAD FRAMES FOR COOLING A POWER DEVICE

TECHNICAL FIELD

The present invention relates to a semiconductor device.

BACKGROUND ART

In a power module used in an in-vehicle inverter or the like, a double-sided cooling power module for cooling a semiconductor element from both sides has been developed in order to enhance heat dissipation performance. For example, PTL 1 discloses a semiconductor device including a first metal portion having a first surface and a second surface opposite to the first surface, a second metal portion having a third surface facing the second surface of the first metal portion and a fourth surface opposite to the third surface, the second metal portion including a protrusion protruding from the third surface and having a fifth surface substantially flush with the first surface of the first metal portion or protruding from the first surface, a semiconductor chip provided between the second surface of the first metal portion and the third surface of the second metal portion, and resin provided around the semiconductor chip so as to expose the first surface of the first metal portion and the fourth surface of the second metal portion.

CITATION LIST

Patent Literature

PTL 1: JP 2016-146457 A

SUMMARY OF INVENTION

Technical Problem

In the semiconductor device described in PTL 1, both surfaces of a semiconductor chip are joined with a metal plate with solder. The metal plate connected to a surface on one side of the semiconductor chip has a projecting shape in which a joint portion protrudes toward the semiconductor chip. In such a structure, when the semiconductor chip and the metal plate are solder-joined, the solder is likely to wet an upper portion of a side surface of a portion having a projecting shape on the metal plate. For this reason, it is not easy to appropriately control a region where the solder wet-spreads, leading to deterioration in quality and productivity.

Solution to Problem

A semiconductor device according to the present invention includes: a semiconductor element; and a first lead frame that is disposed to face the semiconductor element and is connected to the semiconductor element by a first solder material. The first lead frame includes a top surface including a surface facing the semiconductor element, and a side surface connected to a peripheral edge portion of the top surface at a predetermined angle with respect to the top surface, the top surface of the first lead frame includes a solder surface that is in contact with the first solder material and a solder resistance surface on which the first solder material is less wettable than on the solder surface, and the solder resistance surface is formed to surround the periphery of the solder surface.

Advantageous Effects of Invention

According to the present invention, when the semiconductor element and the lead frame are solder-joined in the semiconductor device, it is possible to appropriately control the region where the solder wet-spreads.

DESCRIPTION OF EMBODIMENTS

Hereinafter, a power semiconductor module which is an application example of a semiconductor device according to an embodiment of the present invention will be described with reference to the drawings.

Figure 1:
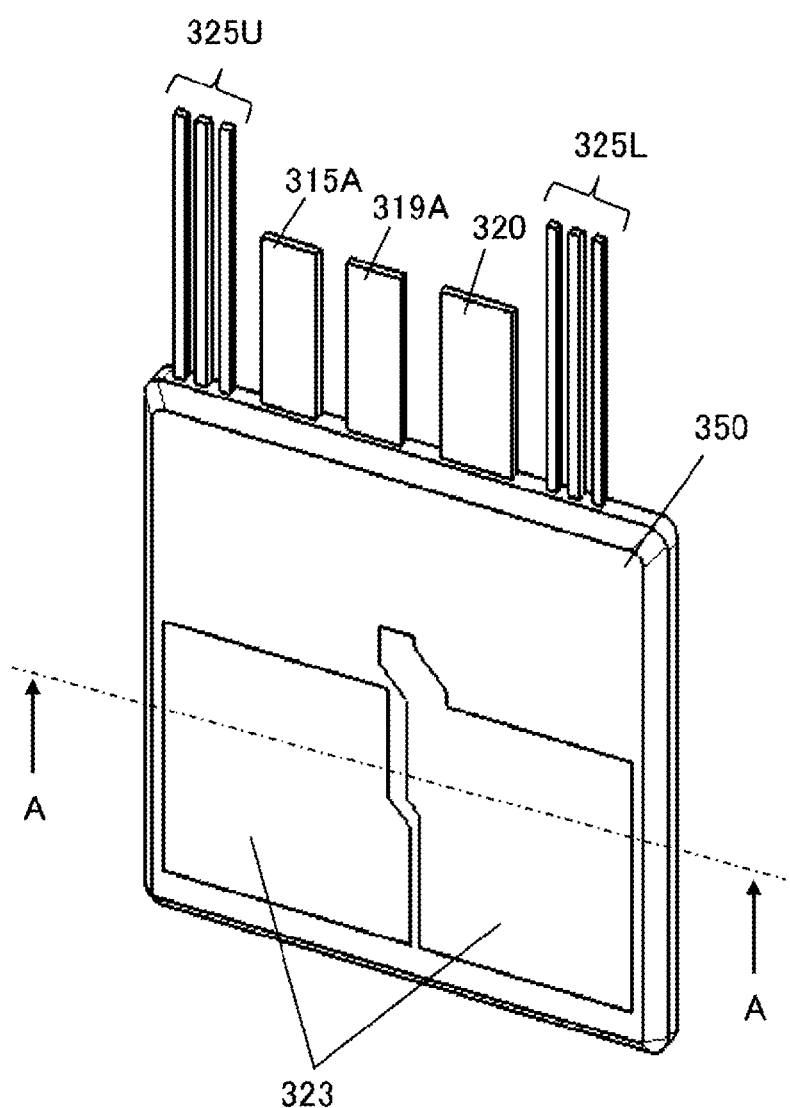
FIG. 1 is an external perspective view of a power semiconductor module according to an embodiment of the present invention.
Figure 2:
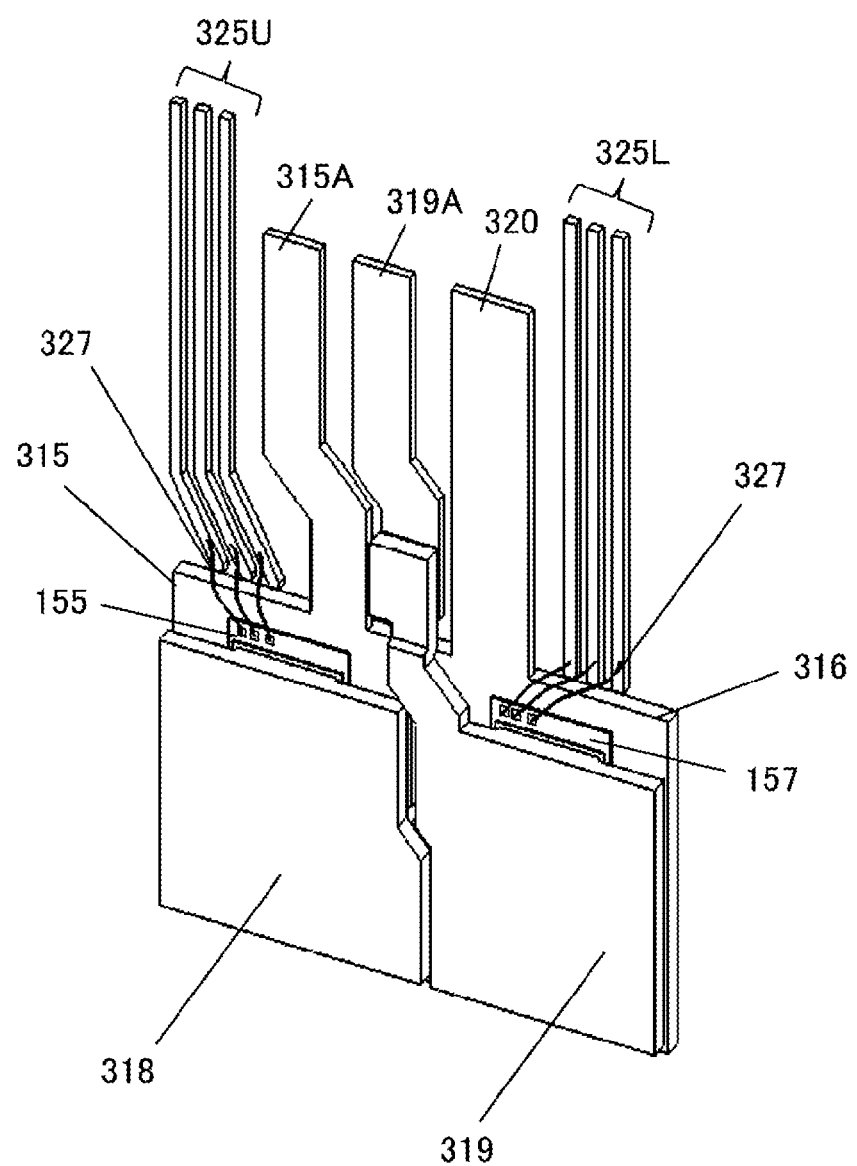
FIG. 2 is a perspective view illustrating an internal configuration of the power semiconductor module according to an embodiment of the present invention.
Figure 3:
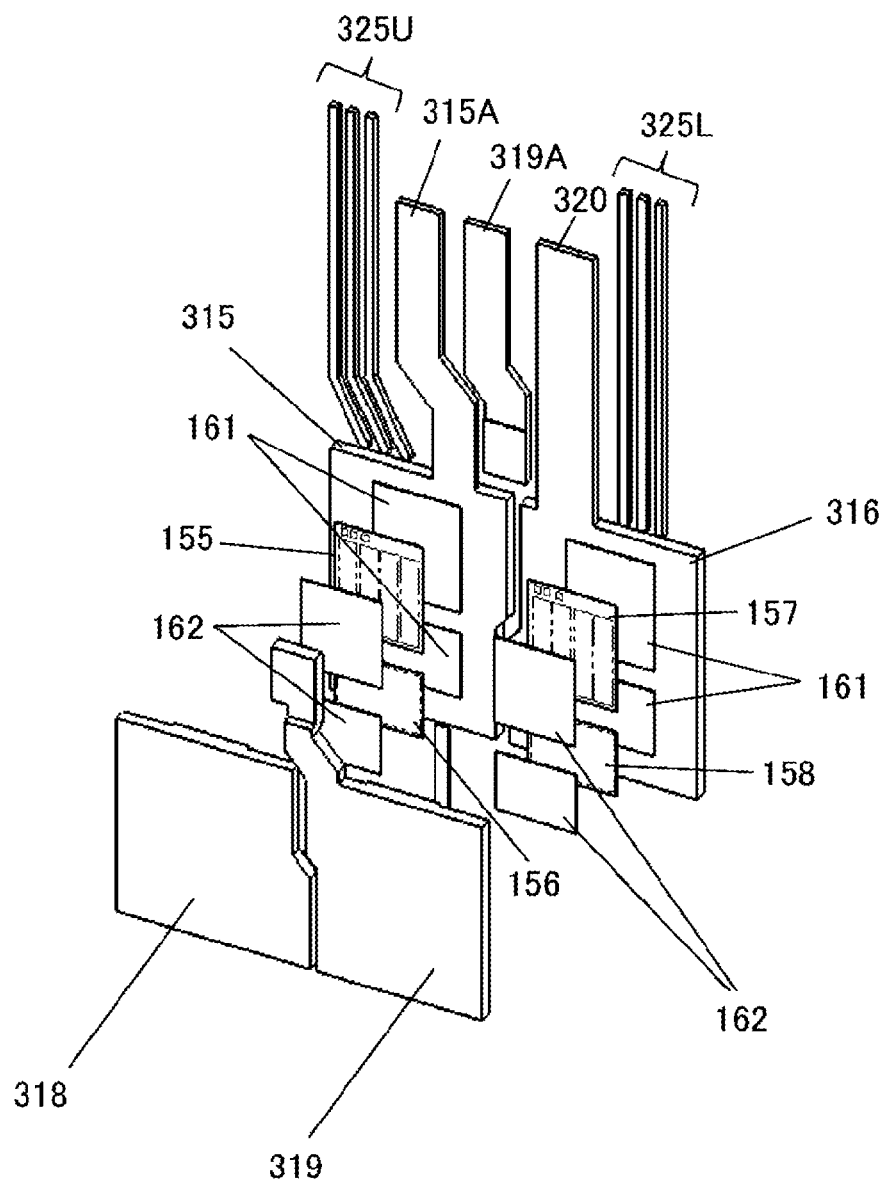
FIG. 3 is a developed view of the power semiconductor module according to an embodiment of the present invention.
Figure 4:
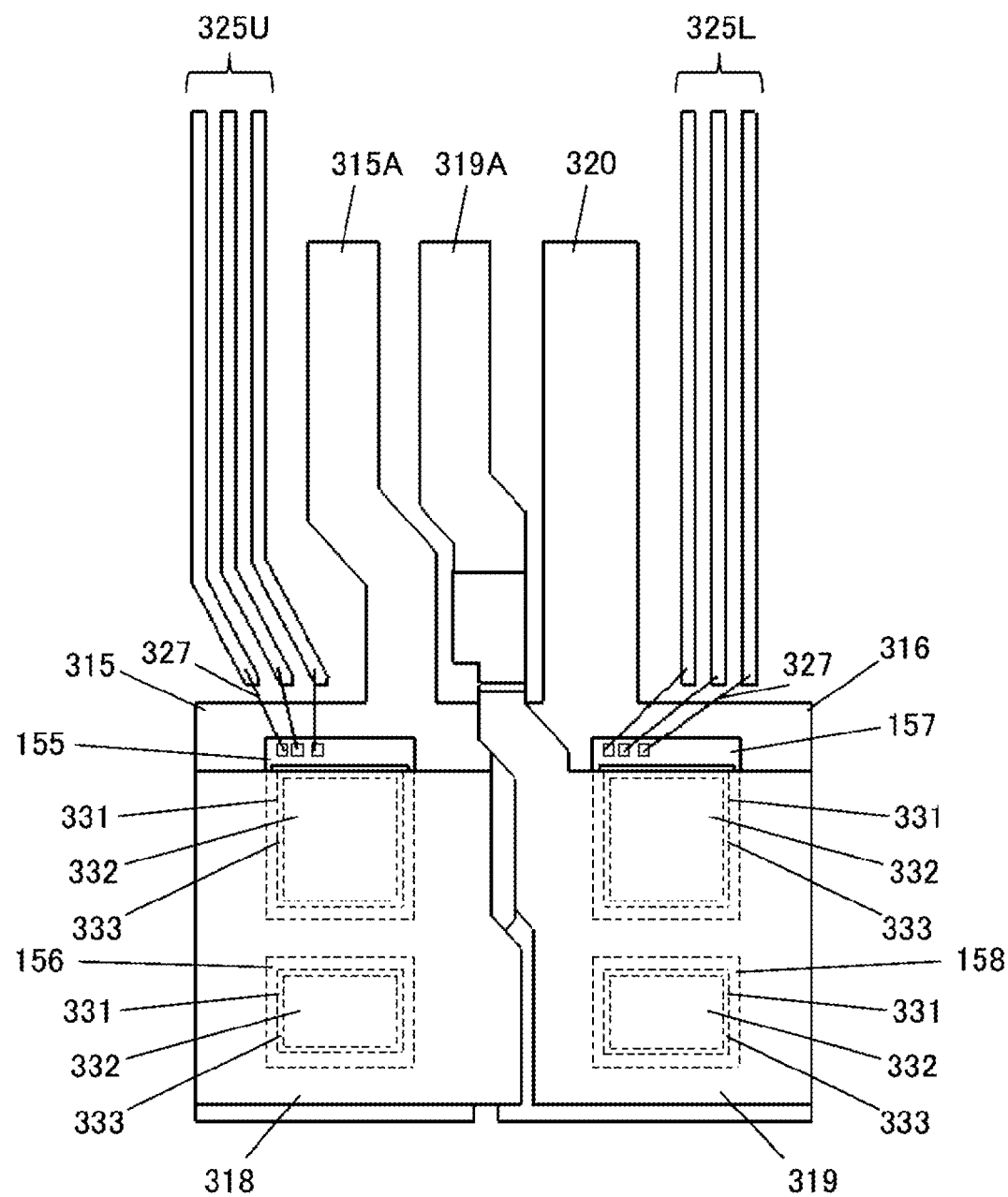
FIG. 4 is a plan view illustrating an internal configuration of the power semiconductor module according to an embodiment of the present invention.

FIG. 1 is an external perspective view of a power semiconductor module 300 according to an embodiment of the present invention. FIG. 2 is a perspective view illustrating an internal configuration of the power semiconductor module 300 according to an embodiment of the present invention, and illustrates a configuration in which a sealing resin 350 is removed from FIG. 1. FIG. 3 is a developed view of the power semiconductor module 300 according to an embodiment of the present invention, and mainly illustrates a structure between a lead frame 315 and a lead frame 318 and between a lead frame 316 and a lead frame 319 of FIG. 2. FIG. 4 is a plan view illustrating an internal configuration of the power semiconductor module 300 according to an embodiment of the present invention, and corresponds to FIG. 2.

As illustrated in FIGS. 2 to 4, semiconductor elements 155 and 156 are joined and fixed to the lead frame 315 and the lead frame 318 made from metal using copper, a copper alloy, and the like on both surfaces in a state where the semiconductor elements 155 and 156 are sandwiched between these lead frames from both surfaces. Further, semiconductor elements 157 and 158 are joined and fixed to the lead frame 316 and the lead frame 319 made from metal using copper, a copper alloy, and the like on both surfaces in a state where the semiconductor elements 157 and 158 are sandwiched between these lead frames from both surfaces. Furthermore, the semiconductor elements 155 and 157 are connected to signal lead wires 325U and 325L, respectively, via a joining wire 327 (see FIG. 2). The semiconductor elements, the lead frames, and the signal lead wires are integrally sealed with the sealing resin 350 while a heat transfer surface 323 of each of the lead frames is exposed (see FIG. 1), so that the power semiconductor module 300 is assembled.

Note that the semiconductor elements 155 and 156 are, for example, an IGBT and a diode, and correspond to an upper arm of an upper and lower arm series circuit of an inverter. Further, similarly, the semiconductor elements 157 and 158 are, for example, an IGBT and a diode, and correspond to a lower arm of an upper and lower arm series circuit of an inverter. The semiconductor element 155 and the semiconductor element 157 perform switching operations at predetermined timings according to a predetermined drive signal input from a driver circuit (not shown), so that DC power input to the power semiconductor module 300 is converted into AC power and output. Alternatively, the semiconductor elements 155 and 157 may be an FET instead of an IGBT. Hereinafter, a case where the semiconductor elements 155 and 157 are an IGBT and the semiconductor elements 156 and 158 are a diode will be described as an example. However, the same applies to a case where the semiconductor elements 155 and 157 are an FET.

Note that FIGS. 2 to 4 illustrate a configuration example in which the power semiconductor module 300 includes one of each of the semiconductor elements 155 to 157. However, the configuration of the power semiconductor module according to the present invention is not limited to this. For example, a plurality of semiconductor elements may be connected in parallel. In an embodiment below, description will be made on the assumption that all of these configurations are included.

The power semiconductor module 300 is provided with a DC positive electrode wiring 315A and a DC negative electrode wiring 319A as a DC bus bar for inputting DC power supplied from a DC power supply (not shown). Further, an AC wiring 320 is provided as an AC bus bar for supplying AC power to a motor (not shown). In the present embodiment, the DC positive electrode wiring 315A and the lead frame 315 are integrally formed, and the DC negative electrode wiring 319A and the lead frame 319 are connected. Further, the AC wiring 320 and the lead frame 316 are integrally formed, and are connected to the lead frame 318. Furthermore, the signal lead wires 325U and 325L for inputting a drive signal from a driver circuit (not shown) are provided.

Here, the arrangement of the semiconductor element and the lead frame will be described in association with an electric circuit. In this embodiment, the lead frame 315 and the lead frame 316 are arranged on substantially the same plane. A collector electrode of the semiconductor element 155, which is, for example, an IGBT, and a cathode electrode of the semiconductor element 156, which is, for example, a diode, are fixed to the lead frame 315. A collector electrode of the semiconductor element 157, which is, for example, an IGBT, and a cathode electrode of the semiconductor element 158, which is, for example, a diode, are fixed to the lead frame 316. Further, the lead frame 318 and the lead frame 319 are arranged on substantially the same plane. An emitter electrode of the semiconductor element 155, which is, for example, an IGBT, and an anode electrode of the semiconductor element 156, which is, for example, a diode, are fixed to the lead frame 318. An emitter electrode of the semiconductor element 157, which is, for example, an IGBT, and an anode electrode of the semiconductor element 158, which is, for example, a diode, are fixed to the lead frame 319. In each of these lead frames, the heat transfer surface 323 is provided as illustrated in FIG. 1 on the side opposite to the fixing surface fixed to each semiconductor element. Note that, although only the heat transfer surface 323 of the lead frames 318 and 319 arranged on the front side are illustrated in FIG. 1, the heat transfer surface 323 is similarly provided for the lead frames 315 and 316 on the back side.

Each semiconductor element has a plate-like flat structure, and each electrode is formed on a front surface or a back surface of the semiconductor element. For this reason, as illustrated in FIGS. 2 and 3, the lead frame 315 and the lead frame 318, and the lead frame 316 and the lead frame 319 are arranged in a stacked shape facing each other in substantially parallel with each other with the semiconductor elements interposed between them, that is, in a manner sandwiching the semiconductor elements. The lead frame 316 and the lead frame 318 are electrically connected. With this connection, an upper arm circuit and a lower arm circuit are electrically connected to form an upper and lower arm series circuit. Note that, for example, in a case where the semiconductor elements 155 and 157 are an IGBT, the gate electrodes of these are connected to the signal lead wires 325U and 325L, respectively, and a drive signal is input from the driver circuit via the signal lead wires.

As illustrated in FIG. 3, electrodes of the semiconductor elements and corresponding lead wires are fixed to each other by being electrically and thermally joined using solder materials 161 and 162. Specifically, the semiconductor elements 155 and 156 are joined to the lead frame 315 by the solder material 161, and are joined to the lead frame 318 by the solder material 162. Further, the semiconductor elements 157 and 158 are joined to the lead frame 316 by the solder material 161, and are joined to the lead frame 319 by the solder material 162. As described above, the DC positive electrode wiring 315A is integrally formed with the lead frame 315, and the DC negative electrode wiring 319A is connected to the lead frame 319.

Figure 5A:
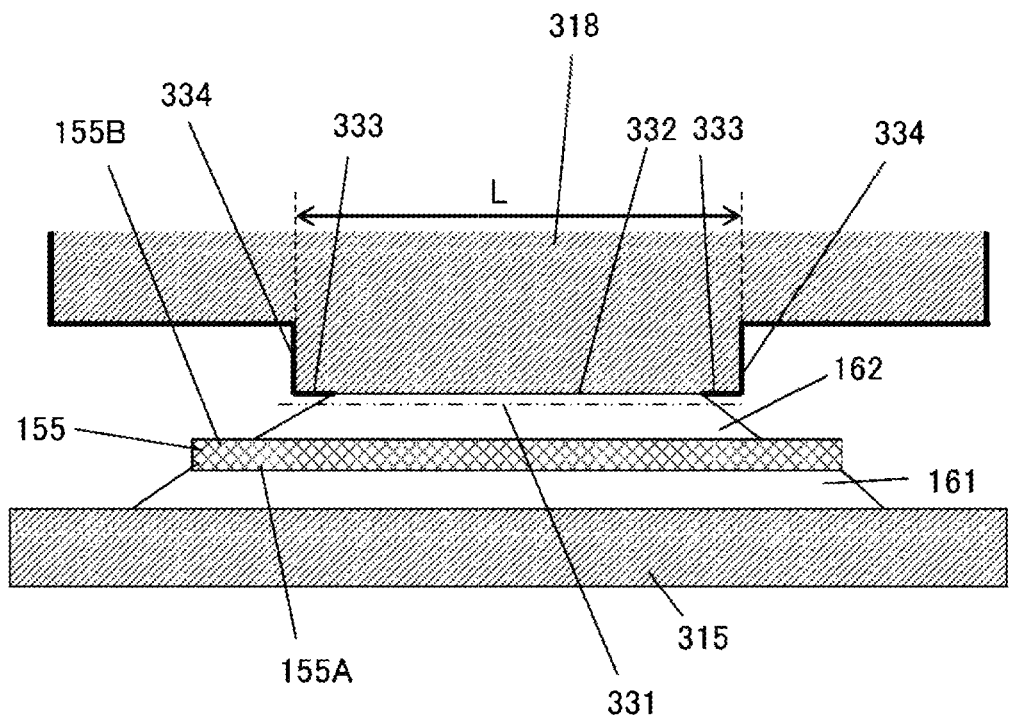
FIGS. 5(a) and 5(b) are cross-sectional views of the power semiconductor module and an enlarged view around a peripheral portion.
Figure 5B:
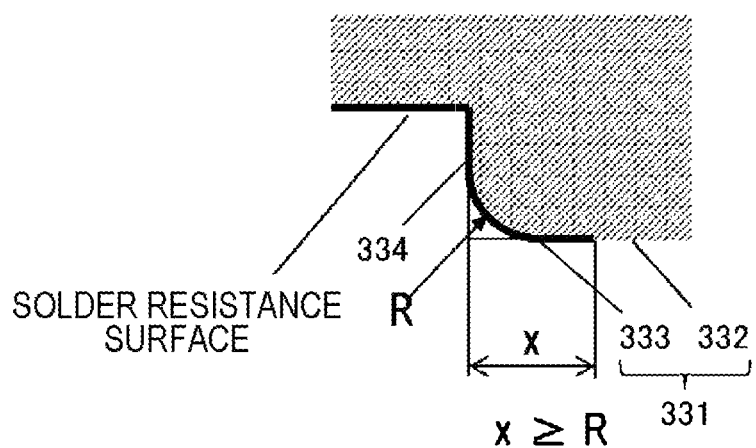

Next, a joint structure between the semiconductor elements and the lead frames in the power semiconductor module 300 will be described in detail with reference to FIGS. 5(a) and 5(b). FIG. 5(a) is a cross-sectional view illustrating a cross section A-A of the power semiconductor module 300, and FIG. 5(b) is an enlarged view around a peripheral edge portion 333 of FIG. 5(a). Note that, hereinafter, as a representative example, the cross section A-A illustrated in the external perspective view of FIG. 1 crosses the semiconductor element 155, and a joint structure between the semiconductor element 155 and the lead frames 315 and 318 is used as an example to describe a joint structure between the semiconductor elements and the lead frames in the power semiconductor module 300 of the present embodiment. However, the joint structure between the semiconductor element 156 and the lead frames 315 and 318 and the joint structure between the semiconductor elements 157 and 158 and the lead frames 316 and 319 have similar characteristics.

As shown in FIG. 5(a), the semiconductor element 155 has a pair of surfaces 155A and 155B parallel to each other, and, on the surface 155A on one side of this pair of the surfaces, a collector electrode surface on which a collector electrode is formed is provided. Further, an emitter electrode surface on which an emitter electrode is formed is provided on the surface 155B on the other side.

The lead frame 315 is disposed to face the collector electrode surface of the semiconductor element 155, and connected to the collector electrode surface of the semiconductor element 155 by the solder material 161. The lead frame 318 is disposed to face the emitter electrode surface of the semiconductor element 155, and is connected to the emitter electrode surface of the semiconductor element 155 by the solder material 162. In this manner, the collector electrode of the semiconductor element 155 is electrically connected to the DC positive electrode wiring 315A via the solder material 161 and the lead frame 315, and the emitter electrode of the semiconductor element 155 is electrically connected to the AC wiring 320 via the solder material 162, the lead frame 318, and the lead frame 316.

The lead frame 318 has a projecting shape in which a portion joined to the solder material 162 protrudes toward the semiconductor element 155, and has a top surface 331 (a surface in a range indicated by a two-dot chain line in the diagram) including a surface facing the semiconductor element 155 and a side surface 334 that forms a predetermined angle with respect to the top surface 331 and is connected to a peripheral edge portion 333 of the top surface 331. Note that, in the example of FIGS. 5(a) and 5(b), the angle formed by the side surface 334 with respect to the top surface 331 is a right angle, that is, approximately 90°. However, the side surface 334 may be formed at an angle other than 90° with respect to the top surface 331. However, in consideration of ease of processing and the like when forming the side surface 334 on the lead frame 318, the angle formed by the side surface 334 with respect to the top surface 331 is preferably 90° or more.

On the top surface 331 of the lead frame 318, a solder surface 332 is formed in a range in contact with the solder material 162. Further, a solder resistance surface on which the solder material 162 is less wettable than the solder surface 332 is formed surrounding the periphery of the solder surface 332. FIGS. 5(a) and 5(b), a range in which the solder resistance surface is formed on the lead frame 318 is indicated by a line thicker than that of the solder surface 332. That is, in the example of FIGS. 5(a) and 5(b), in addition to the peripheral edge portion 333 of the top surface 331, the solder resistance surface is also formed on the side surface 334 and a peripheral portion of the side surface 334. However, the solder resistance surface is only required to be formed in a manner surrounding the periphery of the solder surface 332 at least on the top surface 331 of the lead frame 318, and does not need to include the side surface 334 or a peripheral portion of the side surface 334.

As illustrated in FIG. 5(b), a curved surface formed with a predetermined R value is formed between the solder surface 332 and the side surface 334. The side surface 334 of the lead frame 318 is connected to the peripheral edge portion 333 of the top surface 331 with the curved surface interposed between them. In this manner, the lead frame 318 can be formed by press working and workability is improved. That is, if the joint between the top surface 331 and the side surface 334 is formed in an edge shape instead of a curved surface, additional processing for forming an edge after press working is required, or another processing method such as cutting capable of forming an edge needs to be employed, which results in poor workability. In contrast, as a predetermined R value at the joint between the top surface 331 and the side surface 334 is allowed, press working can be performed, and workability can be greatly improved. Note that the R value is determined according to the thickness, material, and the like of the lead frame 318, and is, for example, about 0.2 to 0.5 mm.

On the top surface 331 of the lead frame 318, the solder resistance surface formed around the solder surface 332 is formed so as to include at least the curved surface. Specifically, for example, as shown in FIG. 5(b), when a length from an intersection of extended lines obtained by extending the top surface 331 and the side surface 334 to a boundary between the solder resistance surface formed on the peripheral edge portion 333 and the solder surface 332 is x, a relationship of x≥R is established.

Furthermore, in a case where the length of the top surface 331 is L as shown in FIG. 5(a), in consideration of conductivity at the joint portion between the lead frame 318 and the semiconductor element 155, it is preferable to make the range of the solder surface 332 on the top surface 331 as wide as possible without making the length x too large. Specifically, for example, it is preferable to set the value of x such that x is ⅓ or less of L, that is, a relationship of x≤L/3 is established.

On the lead frame 318, the solder resistance surface can be formed using, for example, an oxide film on a metal surface or a solder resist material such as epoxy resin. When an oxide film is formed as the solder resistance surface, the thickness of the oxide film is preferably, for example, 1 nm or more in order to secure low wettability for the solder material 162. Further, in a case of either the oxide film or the solder resist material, by removing a part of a surface, on which the oxide film or the solder resist material is formed, of the lead frame 318, it is possible to form the solder surface 332 on which the solder material 162 is more easily wetted than on the solder resistance surface. In this case, a processing trace obtained when removal processing of the surface is performed is formed on the solder surface 332. For the removal processing of the surface, for example, laser processing or the like can be used.

According to the embodiment of the present invention described above, an action and an effect described below are achieved.

(1) The power semiconductor module 300, which a semiconductor device, includes the semiconductor element 155 and the lead frame 318 that is disposed to face the semiconductor element 155 and connected to the semiconductor element 155 by the solder material 162. The lead frame 318 has the top surface 331 including a surface facing the semiconductor element 155, and the side surface 334 connected to the peripheral edge portion 333 of the top surface 331 at a predetermined angle with respect to the top surface 331. The top surface of the lead frame 318 includes the solder surface 332 that is in contact with the solder material 162 and the solder resistance surface on which the solder material 162 is less wettable than on the solder surface 332. The solder resistance surface is formed to surround the periphery of the solder surface 332. In this manner, when the semiconductor element 155 and the lead frame 318 are solder-joined in the power semiconductor module 300 that is a semiconductor device, it is possible to appropriately control the region where the solder wet-spreads.

(2) The power semiconductor module 300 further includes the lead frame 315 connected to the semiconductor element 155 by the solder material 161. The semiconductor element 155 has a pair of the surfaces 155A and 155B parallel to each other, an emitter electrode surface is provided on the surface 155B on one side of a pair of the surfaces, and a collector electrode surface is provided on the surface 155A on the other side. The lead frame 318 is disposed to face the emitter electrode surface, and is connected to the emitter electrode surface of the semiconductor element 155 by the solder material 162. The lead frame 315 is disposed to face the collector electrode surface, and is connected to the collector electrode surface of the semiconductor element 155 by the solder material 161. In this manner, the power semiconductor module 300 having a small size and high heat dissipation can be configured.

(3) The side surface 334 of the lead frame 318 is connected to the peripheral edge portion 333 of the top surface 331 with a curved surface formed with a predetermined R value interposed between them. The solder resistance surface is formed to include the curved surface. In this manner, the workability of the lead frame 318 can be greatly improved.

Note that, in the above embodiment, the example of the semiconductor device in which each semiconductor element is sandwiched and joined to two lead frames from both sides is described. However, the present invention is not limited to this. One in which a lead frame is disposed to face at least a surface on one side of the semiconductor element, a solder surface in contact with a solder material is formed on a top surface of the lead frame, and a solder resistance surface on which the solder material is less wettable than on the solder surface is formed to surround the periphery of the solder surface is included in the application range of the present invention.

The embodiments and various variations described above are merely examples, and the present invention is not limited to the content of these examples unless the characteristics of the invention are impaired. Further, although various embodiments and variations have been described above, the present invention is not limited to the content of these embodiments and variations. Other modes considered within the scope of the technical idea of the present invention are also included in the scope of the present invention.

REFERENCE SIGNS LIST 155, 156, 157, 158 semiconductor element
161, 162 solder material
300 power semiconductor module
315, 316, 318, 319 lead frame
331 top surface
332 solder surface
333 peripheral edge portion
334 side surface

The invention claimed is:

1. A semiconductor device comprising:
    a semiconductor element; and
    a first lead frame that is disposed to face the semiconductor element and is connected to the semiconductor element by a first solder material,
    wherein
    the first lead frame includes a top surface including a surface facing the semiconductor element, and a side surface connected to a peripheral edge portion of the top surface at a predetermined angle with respect to the top surface,
    the top surface of the first lead frame includes a solder surface that is in contact with the first solder material and a solder resistance surface on which the first solder material is less wettable than on the solder surface, and
    the solder resistance surface is formed to surround periphery of the solder surface;
    wherein:
        the side surface of the first lead frame is connected to a peripheral edge portion of the top surface with a curved surface formed with a radius interposed therebetween, and
        the solder resistance surface is formed to include the curved surface.

2. The semiconductor device according to claim 1, further comprising:
    a second lead frame connected to the semiconductor element by a second solder material,
    wherein
    the semiconductor element has a pair of surfaces parallel to each other, a first electrode surface provided on a surface on one side of the pair of surfaces, and a second electrode surface provided on a surface on the other side,
    the first lead frame is disposed to face the first electrode surface, and is connected to the first electrode surface of the semiconductor element by the first solder material, and
    the second lead frame is disposed to face the second electrode surface, and is connected to the second electrode surface of the semiconductor element by the second solder material.

3. The semiconductor device according to claim 1, wherein
    an oxide film is formed on the solder resistance surface.

4. The semiconductor device according to claim 3, wherein
    the oxide film has a thickness of 1 nm or more.

5. The semiconductor device according to claim 1, wherein
    a processing trace is formed on the solder surface of the top surface, the processing trace obtained when removal processing of the top surface is performed.

6. The semiconductor device according to claim 5, wherein
    the removal processing is laser processing.

7. A semiconductor device comprising:
    a semiconductor element; and
    a first lead frame that is disposed to face the semiconductor element and is connected to the semiconductor element by a first solder material,
    wherein
    the first lead frame includes a top surface including a surface facing the semiconductor element, and a side surface connected to a peripheral edge portion of the top surface at a curved surface with respect to the top surface,
    the top surface of the first lead frame includes a solder surface that is in contact with the first solder material and a solder resistance surface on which the first solder material is less wettable than on the solder surface, and surface;
    the solder resistance surface is formed to surround periphery of the solder wherein an oxide film is formed on the solder resistance surface.

* * * * *